United States Patent
Murayama et al.

(10) Patent No.: US 8,674,499 B2
(45) Date of Patent: Mar. 18, 2014

(54) HEAT RADIATION COMPONENT AND SEMICONDUCTOR PACKAGE INCLUDING SAME

(75) Inventors: Kei Murayama, Nagano (JP); Shigeaki Suganuma, Nagano (JP); Masakuni Kitajima, Nagano (JP); Ryuichi Matsuki, Nagano (JP); Hiroyuki Miyajima, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 125 days.

(21) Appl. No.: 13/114,188

(22) Filed: May 24, 2011

(65) Prior Publication Data
US 2011/0291258 A1  Dec. 1, 2011

(30) Foreign Application Priority Data
May 28, 2010 (JP) ................................ 2010-123326

(51) Int. Cl.
*H01L 23/34* (2006.01)
*H01L 23/10* (2006.01)
*H01L 21/00* (2006.01)

(52) U.S. Cl.
USPC ........... 257/712; 257/706; 257/707; 257/720; 438/122

(58) Field of Classification Search
USPC ................ 165/185; 257/678, 706–708, 712, 257/718–720; 438/106, 122; 361/704, 717
See application file for complete search history.

(56) References Cited

U.S. PATENT DOCUMENTS

| 5,608,267 A * | 3/1997 | Mahulikar et al. ............ 257/796 |
| 6,288,900 B1* | 9/2001 | Johnson et al. ............... 361/705 |
| 6,380,621 B1* | 4/2002 | Ando et al. .................... 257/707 |
| 6,882,535 B2* | 4/2005 | Labanok et al. .............. 361/704 |
| 2005/0280128 A1* | 12/2005 | Mok et al. ...................... 257/678 |
| 2009/0059537 A1* | 3/2009 | MacQuarrie et al. ......... 361/711 |
| 2010/0059271 A1* | 3/2010 | Yoneda et al. ................ 174/548 |

FOREIGN PATENT DOCUMENTS

| JP | 4-186869 | 7/1992 |
| JP | 2004-327711 | 11/2004 |

OTHER PUBLICATIONS

V. Sokol, I. Vrublevsky, V. Parkun, K. Moskvichev; Investigation of mechanical properties of anodized aluminum using dilatometric measurements; Anal. Bio. Chem. 375 (2003) 968-973.*

* cited by examiner

*Primary Examiner* — Fernando L Toledo
*Assistant Examiner* — Aaron Gray
(74) *Attorney, Agent, or Firm* — IPUSA, PLLC

(57) ABSTRACT

A heat radiation component configured to be provided through a thermal interface material on a semiconductor device mounted on a board includes a first layer to be positioned on a first side and a second layer stacked on the first layer to be positioned on a second side farther from the semiconductor device than the first side. The coefficient of thermal expansion of the second layer is lower than the coefficient of thermal expansion of the first layer.

5 Claims, 6 Drawing Sheets

HEAT RADIATION COMPONENT AND SEMICONDUCTOR PACKAGE INCLUDING SAME

CROSS-REFERENCE TO RELATED APPLICATION

This application is based upon and claims the benefit of priority of the prior Japanese Patent Application No. 2010-123326, filed on May 28, 2010, the entire contents of which are incorporated herein by reference.

FIELD

A certain aspect of the embodiments discussed herein is related to a heat radiation component and a semiconductor package including the heat radiation component.

BACKGROUND

A semiconductor device used for a central processing unit (CPU) or the like is electrically connected to and fixed on a board. The temperature of the semiconductor device becomes so high at the time of its operation that the semiconductor device cannot function well unless its temperature is forcibly reduced.

Accordingly, a heat radiation component such as a heat spreader or a radiator fin (or a heat pipe) is attached on the semiconductor device to ensure a path for effectively radiating heat generated by the semiconductor device to its outside. Attempts have been made at smooth heat conduction by interposing a thermal interface material (TIM) between the semiconductor device and the heat radiation component such as a heat spreader so that the thermal interface material follows their respective uneven surfaces to reduce thermal contact resistance.

FIG. 1 is a cross-sectional view of a semiconductor package including a conventional heat radiation component. Referring to FIG. 1, a semiconductor package 100 includes a board 200 and a semiconductor device 400 mounted on the board 200 via connection terminals 300. The space between the board 200 and the semiconductor device 400 is filled with underfill resin 500.

A heat radiation component 700 on which a metal layer 750 is formed is attached on the semiconductor device 400. A thermal interface material 600 is interposed between the semiconductor 400 and the metal layer 750. The heat radiation component 700 is fixed to the board 200 with an adhesive agent 800.

In the semiconductor package 100, heat generated by the semiconductor device 400 mounted on the board 200 is transferred to the heat radiation component 700 via the thermal interface material 600 provided on the semiconductor device 400. Thus, the thermal interface material 600 is used as a part configured to thermally connect the semiconductor device 400 and the heat radiation component 700 without their direct contact.

Examples of the material of the thermal interface material 600 include indium, which has good thermal conductivity. For example, in the case of using indium as the material of the thermal interface material 600, the semiconductor package 100 is heated to, for example, approximately 180° C. in order to melt the thermal interface material 600 formed of indium, and is thereafter returned to normal temperature at the time of attaching the heat radiation component 700 onto the semiconductor device 400 through the thermal interface material 600.

Here, for example, the semiconductor device 400 has a coefficient of thermal expansion of approximately 3 ppm/° C. if the semiconductor device 400 is made of silicon, and the board 200 has a coefficient of thermal expansion of approximately 15 ppm/° C. if the board 200 is based on an FR-4 board (a copper-clad laminate having a flame-resistant glass cloth base material impregnated with epoxy resin). Heating the semiconductor package 100 and thereafter returning the semiconductor package 100 to normal temperature as described above results in warpage of the semiconductor package 100 due to the difference in the coefficient of thermal expansion between the semiconductor device 400 and the board 200.

For related art, reference may be made to, for example, Japanese Laid-open Patent Publication No. 4-186869 and Japanese Laid-open Patent Publication No. 2004-327711.

SUMMARY

According to an aspect of the invention, a heat radiation component configured to be provided through a thermal interface material on a semiconductor device mounted on a board includes a first layer to be positioned on a first side; and a second layer stacked on the first layer to be positioned on a second side farther from the semiconductor device than the first side, wherein a coefficient of thermal expansion of the second layer is lower than a coefficient of thermal expansion of the first layer.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
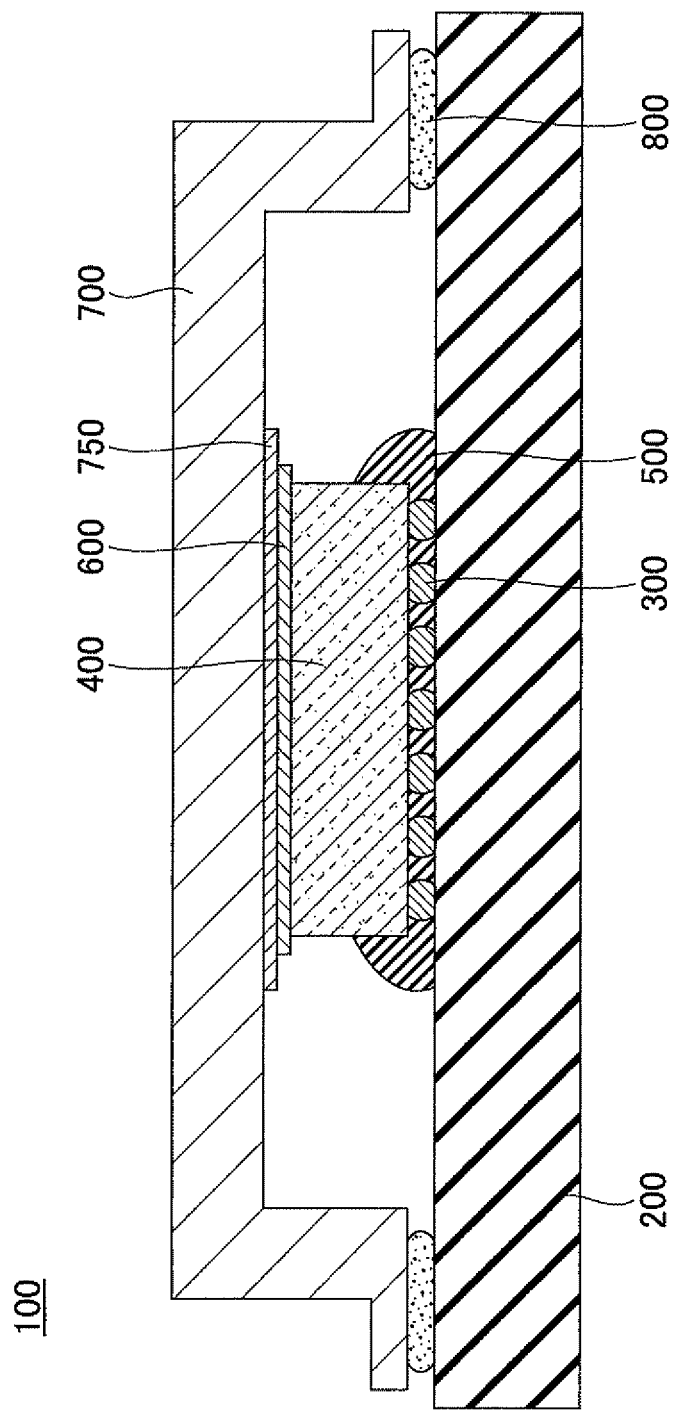
FIG. 1 is a cross-sectional view of a semiconductor package including a conventional heat radiation component.

As described above with reference to FIG. 1, heating the semiconductor package 100 and thereafter returning the semiconductor package 100 to normal temperature results in warpage of the semiconductor package 100.

Figure 2:
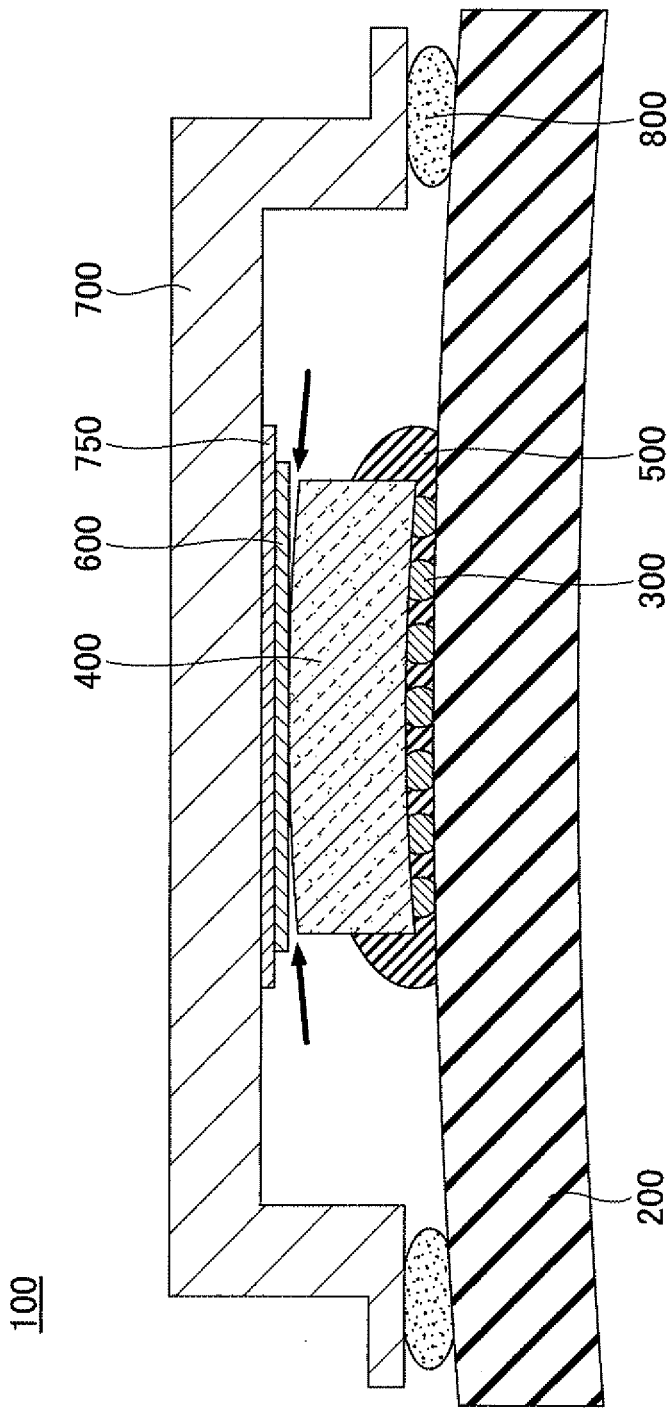
FIG. 2 is a cross-section view of the semiconductor package including the conventional heat radiation component, where warpage has occurred in the semiconductor package.

FIG. 2 is a cross-section view of the semiconductor package including the conventional heat radiation component, where warpage has occurred in the semiconductor package.

As illustrated in FIG. 2, when warpage occurs in the semiconductor package 100, the thermal interface material 600, unable to follow the warpage, is separated from the semiconductor device 400 (as indicated by arrows in FIG. 2), thus causing the problem of reduced heat radiation performance.

According to an aspect of the invention, a heat radiation component configured to prevent separation of a thermal interface material from a semiconductor package and a semiconductor package including the heat radiation component are provided.

Preferred embodiments of the present invention will be explained with reference to accompanying drawings. In the drawings, the same elements are referred to by the same reference numeral, and a redundant description thereof may be omitted.

[a] First Embodiment

Figure 3:
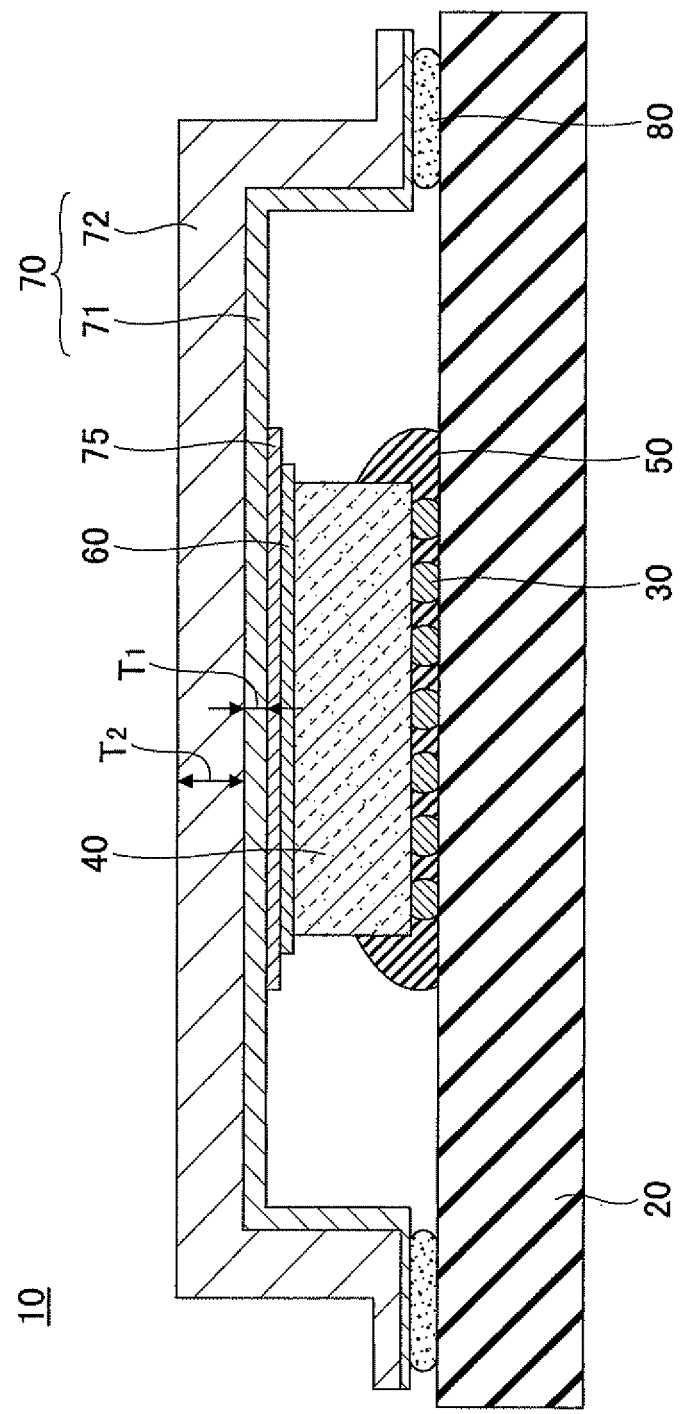
FIG. 3 is a cross-sectional view of a semiconductor package including a heat radiation component according to a first embodiment.

FIG. 3 is a cross-sectional view of a semiconductor package including a heat radiation component according to a first embodiment. Referring to FIG. 3, a semiconductor package 10 includes a board 20 and a semiconductor device 40 mounted on the board 20 via connection terminals 30. The space between the board 20 and the semiconductor device 40 is filled with underfill resin 50.

For example, an FR-4 board (a copper-clad laminate having a flame-resistant glass cloth base material impregnated with epoxy resin) or the like may be used as the board 20. Electrode pads (not graphically illustrated) are formed on the surface of the board 20 on its semiconductor device 40 side. Examples of the board 20 may include various types of wiring boards such as a cureless or cored multilayer wiring board manufactured by a build-up process, a multilayer wiring board having interconnection layers connected with through vias, and an interstitial via hole (IVH) multilayer wiring board having particular interconnection layers connected with IVHs.

The semiconductor device 40 includes a semiconductor substrate of, for example, silicon (Si), germanium (Ge), etc., and a semiconductor integrated circuit (not graphically illustrated) formed in the semiconductor substrate. Electrode pads (not graphically illustrated) are formed on the surface of the semiconductor device 40 on its board 20 side. The electrode pads of the board 20 and the electrode pads of the semiconductor device 40 are electrically connected via the connection terminals 30. Examples of the connection terminals 30 include solder balls.

A heat radiation component 70 on which a metal layer 75 is formed is attached on the semiconductor device 40. A thermal interface material 60 of indium or the like is interposed between the semiconductor 40 and the metal layer 75. The heat radiation component 70 is fixed to the board 20 with an adhesive agent 80.

In the semiconductor package 10, heat generated by the semiconductor device 40 mounted on the board 20 is transferred to the heat radiation component 70 via the thermal interface material 60 provided on the semiconductor device 40. Thus, the thermal interface material 60 is used as a part configured to thermally connect the semiconductor device 40 and the heat radiation component 70 without their direct contact. Examples of the material of the thermal interface material 60 include indium, which has good thermal conductivity.

The metal layer 75 is formed in part of the region of the heat radiation component 70 on its semiconductor device 40 side. The metal layer 75 is formed in order to connect the thermal interface material 60 formed of indium or the like to the heat radiation component 70 with good wettability. The metal layer 75 may be, for example, a gold plating layer. Alternatively, the metal layer 75 may not be formed.

The heat radiation component 70 includes a first layer 71 and a second layer 72. The heat radiation component 70 may be manufactured by, for example, using a clad material and deforming the clad material by pressing. Here, the clad material is a composite material of different kinds of metal rolled into a single plate for bringing out their respective material characteristics. In the heat radiation component 70, the metal, alloy, etc., used for the second layer 72 has a smaller coefficient of thermal expansion than that used for the first layer 71. The clad material may be replaced with a composite material of copper and a carbon material.

Preferable examples of the materials of the first layer 71 and the second layer 72 include metals of high thermal conductivity and their alloys, such as copper (Cu), aluminum (Al), an alloy of copper and tungsten (CuW) (for example, 10% to 20% Cu), an alloy of copper and molybdenum (CuMo) (for example, 15% to 20% Mo), and molybdenum (Mo). The surfaces of the heat radiation component 70 may be plated with nickel (Ni).

Here, copper (Cu) has a thermal conductivity of approximately 390 W/mK. Aluminum (Al) has a thermal conductivity of approximately 247 W/mK. An alloy of copper and tungsten (CuW) (for example, 10% to 20% Cu) has a thermal conductivity of approximately 190 W/mK. An alloy of copper and molybdenum (CuMo) (for example, 15% to 20% Mo) has a thermal conductivity of approximately 165 W/mK. Molybdenum (Mo) has a thermal conductivity of approximately 140 W/mK.

Further, copper (Cu) has a coefficient of thermal expansion of approximately 17 ppm/° C. Aluminum (Al) has a coefficient of thermal expansion of approximately 24 ppm/° C. An alloy of copper and tungsten (CuW) (for example, 10% to 20% Cu) has a coefficient of thermal expansion of approximately 6.5 ppm/° C. to approximately 8.3 ppm/° C. An alloy of copper and molybdenum (CuMo) (for example, 15% to 20% Mo) has a coefficient of thermal expansion of approximately 7 ppm/° C. to approximately 8 ppm/° C. Molybdenum (Mo) has a coefficient of thermal expansion of approximately 5 ppm/° C.

In consideration of the above-described physical property values, in the case of selecting, for example, aluminum (Al) as the material of the first layer 71, copper (Cu), which has a smaller coefficient of thermal expansion than aluminum (Al), may be used as the material of the second layer 72. Further, as another example, in the case of selecting copper (Cu) as the material of the first layer 71, molybdenum (Mo), which has a smaller coefficient of thermal expansion than copper (Cu), may be used as the material of the second layer 72. The materials of the first layer 71 and the second layer 72 may be another combination as long as the combination satisfies the requirement that the metal, alloy, etc., used for the second layer 72 has a smaller coefficient of thermal expansion than that used for the first layer 71.

The thickness of part of the heat radiation component 70 above the semiconductor device 40, which is the sum of the thickness $T_1$ of part of the first layer 71 above the semiconductor device 40 and the thickness $T_2$ of part of the second layer 72 above the semiconductor device 40 ($T_1+T_2$), may be, for example, approximately 1 mm. In the case where the first layer 71 is aluminum (Al) and the second layer 72 is copper (Cu), the thickness $T_1$ of the first layer 71 may be, for example, 0.10 mm, and the thickness $T_2$ of the second layer 72 may be, for example, 0.90 mm. In the case where the first layer 71 is copper (Cu) and the second layer 72 is molybdenum (Mo), the thickness $T_1$ of the first layer 71 may be, for example, 0.76 mm, and the thickness $T_2$ of the second layer 72 may be, for example, 0.24 mm.

Figure 4:
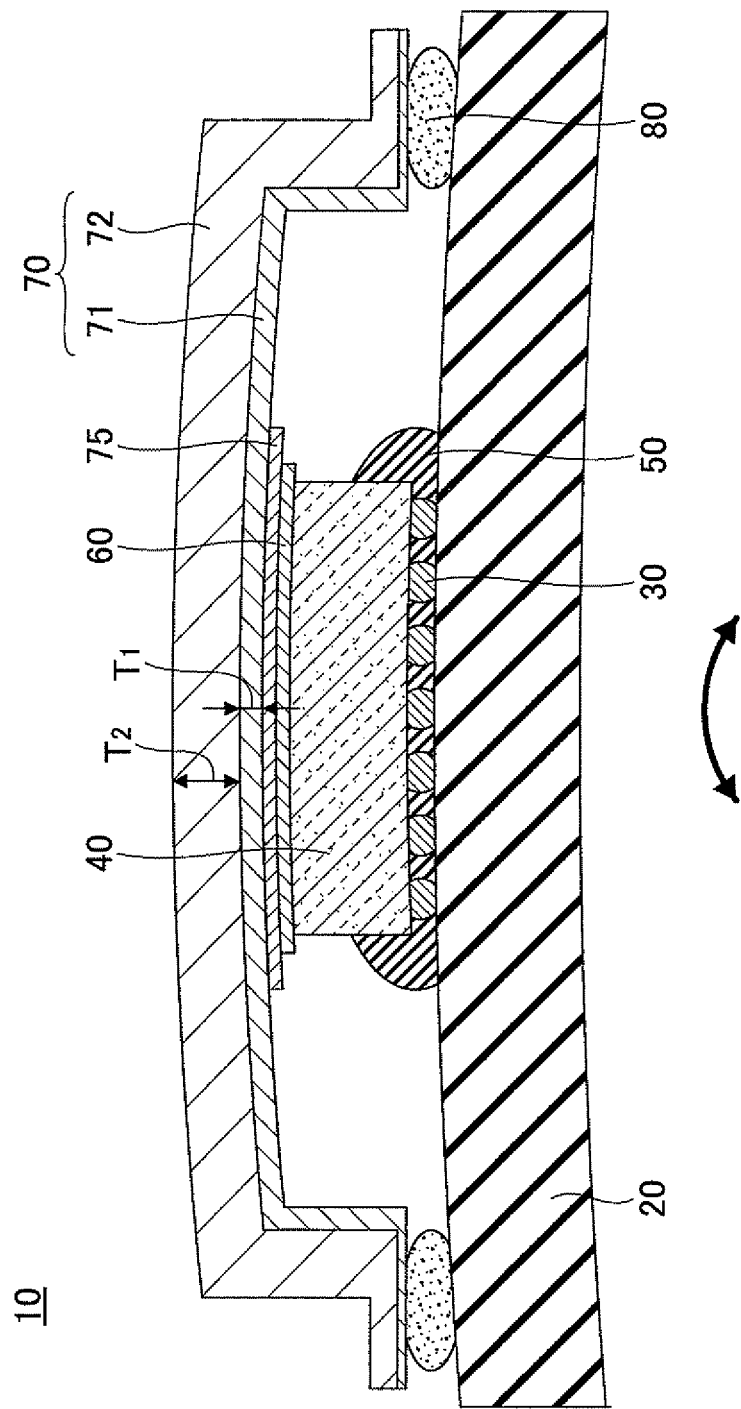
FIG. 4 is a cross-section view of the semiconductor package including the heat radiation component according to the first embodiment, where warpage has occurred in the semiconductor package.

In practice, at the time of manufacturing the semiconductor package 10 (at the time of attaching the heat radiation component 70), the semiconductor package 10 is heated to, for example, approximately 180° C. in order to melt the thermal interface material 60 formed of indium and is thereafter returned to normal temperature when the heat radiation component 70 is attached onto the semiconductor device 40 through the thermal interface material 60. Accordingly, as illustrated in FIG. 4, warpage is caused in the semiconductor package 10 the same as in the conventional semiconductor package 100 (FIG. 2). FIG. 4 is a cross-section view of the semiconductor package including the heat radiation component according to the first embodiment, where warpage has occurred in the semiconductor package.

However, in the heat radiation component 70 according to the first embodiment, the metal, alloy, etc., used for the second layer 72 has a smaller coefficient of thermal expansion than that used for the first layer 71. Therefore, even when warpage occurs in the semiconductor package 10, the heat radiation component 70 warps in the same directions indicated by a double-headed arrow in FIG. 4 as the board 20 and the semiconductor device 40. Accordingly, unlike in the conventional semiconductor package 100, the thermal interface material 60 follows the warpage of the semiconductor device 40, thus making it possible to prevent the thermal interface material 60 from being separated from the semiconductor device 40. As a result, it is possible to prevent a decrease in heat radiation performance in the semiconductor package 10.

Further, after the manufacture of the semiconductor package 10 (after the attachment of the heat radiation component 70), the semiconductor device 40 generates heat during its operation, and the semiconductor device 40 returns to normal temperature when the semiconductor device 40 is not in operation. In the case where such heating and cooling are repeated as well, the heat radiation component 70 warps in the same directions indicated by a double-headed arrow in FIG. 4 as the board 20 and the semiconductor device 40. In this case as well, like at the time of manufacturing the semiconductor package 10 (at the time of attaching the heat radiation component 70), the thermal interface material 60 follows the warpage of the semiconductor device 40. Therefore, it is possible to prevent the thermal interface material 60 from being separated from the semiconductor device 40. As a result, it is possible to prevent a decrease in heat radiation performance in the semiconductor package 10.

Here, the heat radiation component 70 warps in the same directions as the board 20 and the semiconductor device 40 because the magnitude relationship between the coefficients of thermal expansion of the first layer 71 and the second layer 72 of the heat radiation component 70 is determined to be the same as the magnitude relationship between the coefficients of thermal expansion of the board 20 and the semiconductor device 40.

The degree of warpage of the heat radiation component 70 increases as the difference between the coefficients of thermal expansion of the first layer 71 and the second layer 72 increases. Therefore, by selecting (determining) a suitable difference between the coefficients of thermal expansion of the first layer 71 and the second layer 72 in accordance with the warpage of the board 20 and the semiconductor device 40, it is possible to match the degree of warpage of the heat radiation component 70 with the degree of warpage of the board 20 and the semiconductor device 40.

Specifically, the difference between the coefficients of thermal expansion of the first layer 71 and the second layer 72 may be substantially the same as the difference between the coefficients of thermal expansion of the board 20 and the semiconductor device 40. For example, the coefficient of thermal expansion of the board 20 is approximately 15 ppm/° C. if the board 20 is based on an FR-4 board, and the coefficient of thermal expansion of the semiconductor device 40 is approximately 3 ppm/° C. if the semiconductor device 40 is made of silicon, so that the difference is approximately 12 ppm/° C. In this case, if aluminum (Al), whose coefficient of thermal expansion is approximately 24 ppm/° C., is used as the material of the first layer 71 and copper (Cu), whose coefficient of thermal expansion is approximately 17 ppm/° C., is used as the material of the second layer 72, their difference is approximately 7 ppm/° C., so that the difference from the difference between the coefficients of thermal expansion of the first layer 71 and the second layer 72, which is approximately 12 ppm/° C., is approximately 5 ppm/° C. Thus, it is preferable that the difference between the difference between the coefficients of thermal expansion of the first layer 71 and the second layer 72 and the difference between the coefficients of thermal expansion of the board 20 and the semiconductor device 40 be less than or equal to 5 ppm/° C.

As another example, copper (Cu), whose coefficient of thermal expansion is approximately 17 ppm/° C., is used as the material of the first layer 71, and molybdenum (Mo), whose coefficient of thermal expansion is approximately 5 ppm/° C., is used as the material of the second layer 72. In this case, the difference is approximately 12 ppm/° C., which is substantially the same as the difference between the coefficients of thermal expansion of the first layer 71 and the second layer 72, which is approximately 12 ppm/° C. Thus, the difference is more suitable.

As described above, according to the first embodiment, a heat radiation component is configured to include a first layer and a second layer, and as the material of the second layer, which is disposed (positioned) on the far side relative to a semiconductor device, a metal, an alloy, etc., having a smaller coefficient of thermal expansion than the material of the first layer, which is disposed (positioned) on the near side relative to the semiconductor device, is used. As a result, even when warpage occurs in the semiconductor device as a result of repeated heating and cooling, the heat radiation component warps in the same directions as the semiconductor device. Therefore, a thermal interface material interposed between the semiconductor device and the heat radiation component is allowed to follow the warpage of the semiconductor device, so that it is possible to prevent separation of the thermal interface material from the semiconductor device. As a result, it is possible to prevent a decrease in heat radiation performance in a semiconductor package.

Further, in the heat radiation component according to the first embodiment, the ratio of copper (Cu) used may be smaller than that conventionally used. Since the specific gravity of copper (Cu) is high, this makes it possible to reduce the weight of the heat radiation component and further to reduce the weight of the entire semiconductor package.

Further, the heat radiation component according to the first embodiment is allowed to follow the warpage of the semiconductor device. Therefore, it is possible to reduce the thickness of the thermal interface material interposed between the heat radiation component and the semiconductor device. This reduces the manufacturing cost of the entire semiconductor package particularly in the case of using a costly material such as indium as the thermal interface material.

Next, a description is given of a variation of the first embodiment.

In the variation of the first embodiment, a case is illustrated where the thickness of part of the first layer above the semiconductor device is greater than the thickness of other parts of the first layer.

Figure 5:
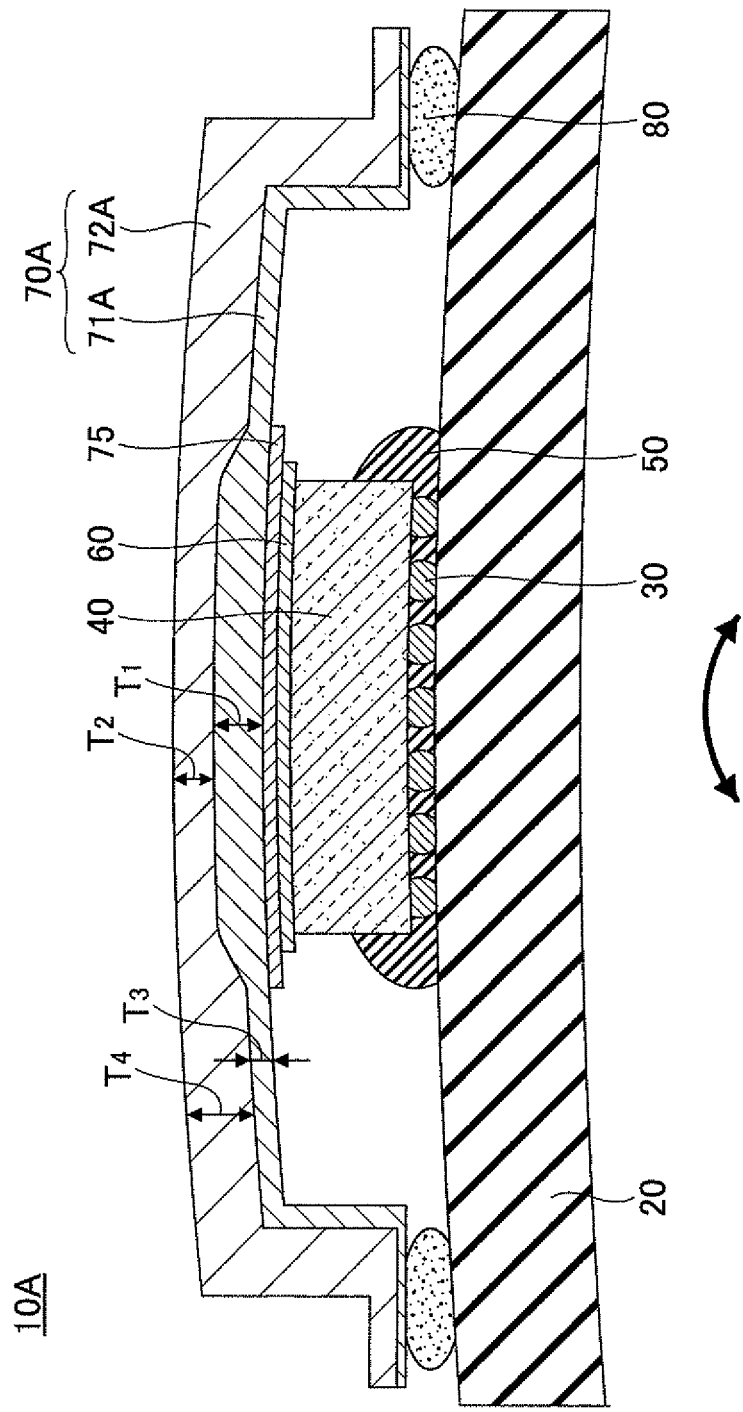
FIG. 5 is a cross-section view of a semiconductor package including a heat radiation component according to a variation of the first embodiment, where warpage has occurred in the semiconductor package.

FIG. 5 is a cross-section view of a semiconductor package including a heat radiation component according to the variation of the first embodiment, where warpage has occurred in the semiconductor package. Referring to FIG. 5, a semiconductor package 10A is different from the semiconductor package 10 of the first embodiment in that the heat radiation component 70 of the semiconductor package 10 is replaced with a heat radiation component 70A. In the following, in the semiconductor package 10A, the same elements as those of the semiconductor package 10 are referred to by the same reference numerals, and a description thereof is omitted.

The heat radiation component 70A includes a first layer 71A and a second layer 72A. A material, etc., used for the heat radiation component 70A may be the same as in the case of the heat radiation component 70. In the heat radiation component 70A, the thickness $T_1$ of part of the first layer 71A above the semiconductor device 40 is greater than a thickness $T_3$ of other parts of the first layer 71A. Further, the thickness $T_2$ of part of the second layer 72A above the semiconductor device 40 is smaller than a thickness $T_4$ of other parts of the second layer 71A. The thickness of part of the heat radiation component 70A above the semiconductor device 40 ($T_1+T_2$) may be, for example, approximately 1 mm, the same as in the heat radiation component 70.

By thus making the thickness $T_1$ greater than the thickness $T_3$, it is possible to make it easier for the heat radiation component 70A to warp in the directions indicated by a double-headed arrow in FIG. 5. A proportion by which the thickness $T_1$ is greater than the thickness $T_3$ may be suitably determined in accordance with a desired degree of warpage. For example, the thickness $T_1$ may be greater than the thickness $T_3$ by approximately 10%. The first layer 71A may be easily partially increased in thickness by adjusting pressing conditions in the case of, for example, using a clad material or the like for the heat radiation component 70A and deforming the clad material or the like by pressing.

In the heat radiation component 70A, in the case where the first layer 71A is aluminum (Al) and the second layer 72A is copper (Cu), the thickness $T_1$ and the thickness $T_3$ of the first layer 71A may be, for example, 0.11 mm and 0.10 mm, respectively, and the thickness $T_2$ and the thickness $T_4$ of the second layer 72A may be, for example, 0.89 mm and 0.90 mm, respectively. In the case where the first layer 71A is copper (Cu) and the second layer 72A is molybdenum (Mo), the thickness $T_1$ and the thickness $T_3$ of the first layer 71A may be, for example, 0.84 mm and 0.76 mm, respectively, and the thickness $T_2$ and the thickness $T_4$ of the second layer 72A may be, for example, 0.16 but and 0.24 mm, respectively.

The same effect is produced by increasing the thickness of the entire first layer 71A including the part of the thickness $T_3$. However, in the case of using a metal or an alloy having a high specific gravity, such as copper (Cu), for the first layer 71A, an increase in the thickness of the entire first layer 71A results in an increase in the weight of the heat radiation component 70A. Therefore, by increasing the thickness of only a part to be desired to warp (a part above the semiconductor device 40), it is possible to reduce the weight of the heat radiation component 70A.

As described above, according to the variation of the first embodiment, the same effects as in the first embodiment are produced. In addition, the following effects are produced. That is, the degree of warpage of the heat radiation component, which may be controlled by selecting the materials of the first layer and the second layer, may be further controlled by increasing the thickness of part of the heat radiation component which part is positioned above the semiconductor device compared with other parts of the first layer.

Further, by increasing the thickness of only a part to be desired to warp (a part above the semiconductor device) instead of increasing the thickness of the entire first layer, it is possible to reduce the weight of the heat radiation component.

[b] Second Embodiment

In a second embodiment, a case is illustrated where the heat radiation component is composed of three layers.

Figure 6:
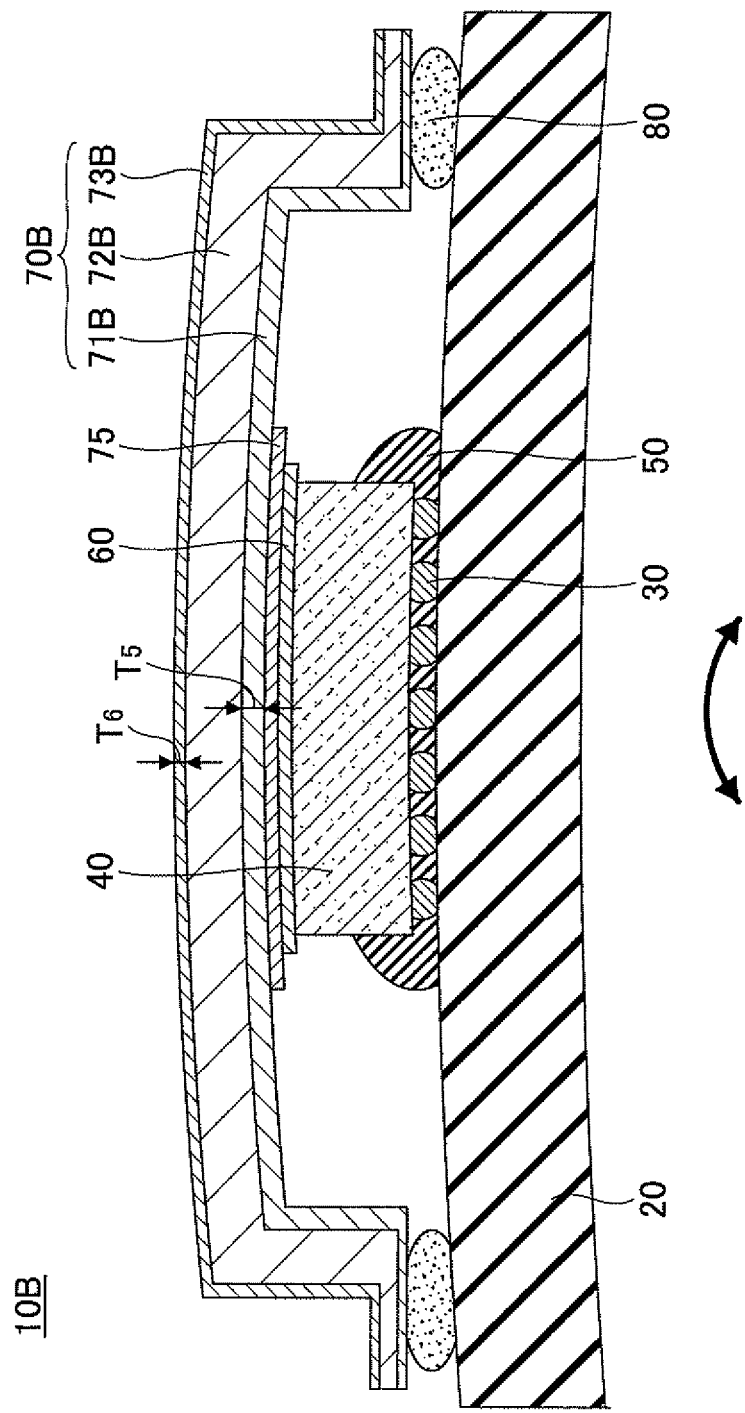
FIG. 6 is a cross-section view of a semiconductor package including a heat radiation component according to a second embodiment, where warpage has occurred in the semiconductor package.

FIG. 6 is a cross-sectional view of a semiconductor package including a heat radiation component according to the second embodiment, where warpage has occurred in the semiconductor package. Referring to FIG. 6, a semiconductor package 10B is different from the semiconductor package 10 of the first embodiment in that the heat radiation component 70 of the semiconductor package 10 is replaced with a heat radiation component 70B. In the following, in the semiconductor package 10B, the same elements as those of the semiconductor package 10 are referred to by the same reference numerals, and a description thereof is omitted.

The heat radiation component 70B includes a first layer 71B, a second layer 72B, and a third layer 73B. The heat radiation component 70B may be manufactured by, for example, deforming the second layer 72B formed of metal or an alloy into its shape as illustrated in FIG. 6 by pressing and thereafter forming the first layer 71B and the third layer 73B by plating one on each side of the second layer 72B. In the heat radiation component 70B, the first layer 71B is thicker than the third layer 73B.

Preferable examples of the material of the second layer 72B include metals of high thermal conductivity and their alloys, such as copper (Cu), aluminum (Al), an alloy of copper and tungsten (CuW) (for example, 10% to 20% Cu), an alloy of copper and molybdenum (CuMo) (for example, 15% to 20% Mo), and molybdenum (Mo).

Examples of the first layer 71B and the third layer 73B include nickel (Ni) plating layers. Nickel (Ni) has a coefficient of thermal expansion of approximately 15 ppm/°C. For example, by forming the second layer 72B of copper (Cu) and employing nickel (Ni) layers for the first layer 71B and the third layer 73B and making the first layer 71B thicker than the third layer 73B, it is possible to make the heat radiation component 70B easily warpable in the directions indicated by a double-headed arrow in FIG. 6. This is because by making the first layer 71B thicker than the third layer 73B, the thermal expansion of the first layer 71B is higher than the thermal expansion of the third layer 73B, so that the coefficient of thermal expansion is apparently higher on the side closer to the semiconductor device 40.

A proportion by which a thickness $T_5$ of the first layer 71B is greater than a thickness $T_6$ of the third layer 73B may be suitably determined in accordance with a desired degree of warpage. For example, the thickness of the entire part of the head radiation component 70B which part is positioned above the semiconductor device 40 may be 1 mm, and the thickness $T_5$ and the thickness $T_6$ may be approximately 20 μm to approximately 30 μm and approximately 10 μm to approximately 15 μm, respectively. In the case of using nickel (Ni)

plating layers as the first layer 71B and the third layer 73B, the thickness $T_5$ and the thickness $T_6$ may be easily controlled by changing time for nickel (Ni) plating in forming the respective layers.

In place of plating the surfaces of copper (Cu) with nickel (Ni), alumina ($Al_2O_3$) may be formed on the surfaces of aluminum (Al) by an anodizing process. In this case as well, the same effects may be produced by causing alumina ($Al_2O_3$) to be thicker on the semiconductor device side.

As described above, according to the second embodiment, a heat radiation component is composed of three layers with layers of the same metal, alloy, etc., different in thickness formed on the top and the bottom, respectively, of the center layer (so that the semiconductor device-side layer is greater in thickness). This makes it possible to cause the coefficient of thermal expansion to apparently differ, so that it is possible to cause the heat radiation component to warp in desired directions with ease. As a result, even when warpage occurs in the semiconductor device as a result of repeated heating and cooling, the heat radiation component warps in the same directions as the semiconductor device. Therefore, a thermal interface material interposed between the semiconductor device and the heat radiation component is allowed to follow the warpage of the semiconductor device, so that it is possible to prevent separation of the thermal interface material from the semiconductor device. As a result, it is possible to prevent a decrease in heat radiation performance in a semiconductor package.

Further, in the heat radiation component according to the second embodiment, the ratio of copper (Cu) used may be smaller than that conventionally used. Since the specific gravity of copper (Cu) is high, this makes it possible to reduce the weight of the heat radiation component and further to reduce the weight of the entire semiconductor package.

Further, the heat radiation component according to the second embodiment is allowed to follow the warpage of the semiconductor device. Therefore, it is possible to reduce the thickness of the thermal interface material interposed between the heat radiation component and the semiconductor device. This reduces the manufacturing cost of the entire semiconductor package particularly in the case of using a costly material such as indium as the thermal interface material.

The second embodiment may be further applied to the first embodiment and its variation. In these cases, the heat radiation component is four-layered.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. A heat radiation component configured to be provided through a thermal interface material on a semiconductor device mounted on a board, the heat radiation component comprising:
   a first layer to be positioned on a first side; and
   a second layer stacked on a surface of the first layer to be positioned on a second side farther from the semiconductor device than the first side, wherein the entire second layer is in direct contact with the entire surface of the first layer,
   wherein a coefficient of thermal expansion of the second layer is lower than a coefficient of thermal expansion of the first layer,
   wherein a first part of the first layer to be positioned above the semiconductor device is thicker than a second part of the first layer other than the first part thereof, and a first part of the second layer to be positioned above the semiconductor device is thinner than a second part of the second layer other than the first part thereof,
   wherein the second part of the second layer has a constant thickness and extends with the constant thickness from the first part of the second layer in a direction in which the first part of the second layer extends, and
   wherein a sum of a thickness of the first part of the first layer and a thickness of the first part of the second layer is equal to a sum of a thickness of the second part of the first layer and the constant thickness of the second part of the second layer.

2. The heat radiation component as claimed in claim 1, wherein a difference is less than or equal to 5 ppm/° C. between a first difference between the coefficient of thermal expansion of the first layer and the coefficient of thermal expansion of the second layer and a second difference between a coefficient of thermal expansion of the board and a coefficient of thermal expansion of the semiconductor device.

3. The heat radiation component as claimed in claim 1, further comprising:
   a third layer on a side of the first layer which side is to face toward the semiconductor device; and
   a fourth layer on a side of the second layer which side is to face away from the semiconductor device,
   wherein the third layer and the fourth layer are formed of a same material, and
   the third layer is thicker than the fourth layer.

4. The heat radiation component as claimed in claim 3, wherein the third layer and the fourth layer are formed of plating.

5. A semiconductor package, comprising:
   a semiconductor device mounted on a board through connection terminals; and
   a heat radiation component provided on the semiconductor device through a thermal interface material,
   the heat radiation component including
      a first layer to be positioned on a first side; and
      a second layer stacked on a surface of the first layer to be positioned on a second side farther from the semiconductor device than the first side, wherein the entire second layer is in direct contact with the entire surface of the first layer,
   wherein a coefficient of thermal expansion of the second layer is lower than a coefficient of thermal expansion of the first layer,
   wherein a first part of the first layer to be positioned above the semiconductor device is thicker than a second part of the first layer other than the first part thereof, and a first part of the second layer to be positioned above the semiconductor device is thinner than a second part of the second layer other than the first part thereof,
   wherein the second part of the second layer has a constant thickness and extends with the constant thickness from the first part of the second layer in a direction in which the first part of the second layer extends, and
   wherein a sum of a thickness of the first part of the first layer and a thickness of the first part of the second layer is equal to a sum of a thickness of the second part of the first layer and the constant thickness of the second part of the second layer.

* * * * *